US010290502B2

(12) United States Patent
Wang et al.

(10) Patent No.: US 10,290,502 B2
(45) Date of Patent: May 14, 2019

(54) APPARATUS FOR REDUCING STRIPE PATTERNS

(71) Applicant: Taiwan Semiconductor Manufacturing Company, Ltd., Hsin-Chu (TW)

(72) Inventors: Chung Chien Wang, Shanhua Township (TW); Yeur-Luen Tu, Taichung (TW); Cheng-Ta Wu, Shueishang Township (TW); Chia-Shiung Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/816,593

(22) Filed: Aug. 3, 2015

(65) Prior Publication Data
US 2015/0352665 A1    Dec. 10, 2015

Related U.S. Application Data

(62) Division of application No. 13/371,303, filed on Feb. 10, 2012, now Pat. No. 9,099,389.

(51) Int. Cl.
G01B 11/14    (2006.01)
H01L 21/268    (2006.01)
H01L 27/146    (2006.01)

(52) U.S. Cl.
CPC ............ H01L 21/268 (2013.01); G01B 11/14 (2013.01); H01L 27/1464 (2013.01); H01L 27/14643 (2013.01); H01L 27/14689 (2013.01)

(58) Field of Classification Search
USPC ..................... 257/E21.347; 438/73
See application file for complete search history.

(56) References Cited

U.S. PATENT DOCUMENTS 7,714,997 B2 *   5/2010   Shibata ................. G01N 21/21
                                                        356/237.2
7,901,974 B2    3/2011    Venezia et al.
(Continued)

FOREIGN PATENT DOCUMENTS

JP    2008177485    7/2008
KR    2010078631    7/2010
(Continued)

OTHER PUBLICATIONS

Li et al. "Enabling Manufacturing Productivity Improvement and Test Wafer Cost Reduction", Summer 2007, Yield Managment Solutions, www.kla-tencor.com/ymsmagazine, pp. 11-13.*
(Continued)

Primary Examiner — Telly D Green
(74) Attorney, Agent, or Firm — Slater Matsil, LLP

(57) ABSTRACT

An apparatus comprises an optical detector configured to receive scattered light signals from a surface of a wafer including a plurality of sensor arrays, each of which has a boundary smaller than a boundary of a laser beam, a light source optically coupled to the surface of the wafer, wherein light from the light source hits the surface with a small incident angle and a processor configured to measure a distance between a sensor array boundary and a laser beam boundary, wherein a laser annealing process is recalibrated if the distance is less than a predetermined value.

20 Claims, 5 Drawing Sheets

(56) References Cited

U.S. PATENT DOCUMENTS

| | | | |
|---|---|---|---|
| 7,990,415 B2* | 8/2011 | Matsumoto | G01C 15/004 |
| | | | 348/135 |
| 8,004,666 B2* | 8/2011 | Shibata | G01N 21/21 |
| | | | 356/237.1 |
| 8,017,427 B2 | 9/2011 | Manabe | |
| 8,018,016 B2 | 9/2011 | McCarten et al. | |
| 8,154,062 B2* | 4/2012 | Park | H01L 27/14601 |
| | | | 257/291 |
| 8,228,494 B2* | 7/2012 | Shibata | G01N 21/21 |
| | | | 356/237.2 |
| 8,278,690 B2 | 10/2012 | Mao et al. | |
| 8,304,354 B2 | 11/2012 | Hsu et al. | |
| 8,390,089 B2 | 3/2013 | Chen et al. | |
| 8,628,998 B2 | 1/2014 | Lin et al. | |
| 2001/0030296 A1* | 10/2001 | Ishimaru | G01N 21/474 |
| | | | 250/559.4 |
| 2004/0207836 A1* | 10/2004 | Chhibber | G01N 21/4738 |
| | | | 356/237.4 |
| 2005/0185172 A1* | 8/2005 | Ishimaru | G01N 21/474 |
| | | | 356/237.2 |
| 2008/0144023 A1* | 6/2008 | Shibata | G01N 21/21 |
| | | | 356/237.2 |
| 2010/0006908 A1* | 1/2010 | Brady | H01L 27/1463 |
| | | | 257/291 |
| 2010/0006970 A1* | 1/2010 | Brady | H01L 21/84 |
| | | | 257/447 |
| 2010/0148290 A1* | 6/2010 | Park | H01L 27/14601 |
| | | | 257/432 |
| 2010/0208249 A1* | 8/2010 | Shibata | G01N 21/21 |
| | | | 356/237.2 |
| 2010/0220226 A1 | 9/2010 | Wang et al. | |
| 2011/0196637 A1* | 8/2011 | Sharpe | G01N 15/1012 |
| | | | 702/104 |
| 2011/0263069 A1 | 10/2011 | Hsu et al. | |
| 2011/0292390 A1* | 12/2011 | Shibata | G01N 21/21 |
| | | | 356/369 |
| 2011/0309233 A1* | 12/2011 | Seo | B82Y 20/00 |
| | | | 250/208.1 |
| 2012/0009716 A1* | 1/2012 | Chang | H01L 27/14618 |
| | | | 438/65 |
| 2013/0083229 A1* | 4/2013 | Lin | H01L 27/14623 |
| | | | 348/336 |

FOREIGN PATENT DOCUMENTS

| | | |
|---|---|---|
| TW | 201112411 | 4/2011 |
| TW | 201137977 | 11/2011 |
| TW | 201137980 | 11/2011 |
| TW | 201205793 | 2/2012 |

OTHER PUBLICATIONS

Teng et al. "A Novel Method of Characterizing Post-laser Anneal Surface Conditions for the 45nm Process Technology Node", 2008, Yield Management Solutions, Issue 1, , www.kla-tencor.com/ymsmagazine, pp. 1-3.*

Heuvel et al. "Unpatterned Wafer Inspection for Immersion Lithography Defectivity", Spring 2007, Yield Managment Solutions, www.kla-tencor.com/ymsmagazine, pp. 33-39.*

* cited by examiner

APPARATUS FOR REDUCING STRIPE PATTERNS

This application is a divisional of U.S. patent application Ser. No. 13/371,303, entitled "Method and Apparatus for Reducing Stripe Patterns," filed on Feb. 10, 2012, which application is incorporated herein by reference.

BACKGROUND

As technologies evolve, complementary metal-oxide semiconductor (CMOS) image sensors are gaining in popularity over traditional charged-coupled devices (CCDs) due to certain advantages inherent in the CMOS image sensors. In particular, a CMOS image sensor may have a high image acquisition rate, a lower operating voltage, lower power consumption and higher noise immunity. In addition, CMOS image sensors may be fabricated on the same high volume wafer processing lines as logic and memory devices. As a result, a CMOS image chip may comprise both image sensors and all the necessary logics such as amplifiers, A/D converters and the like.

CMOS image sensors are pixelated metal oxide semiconductors. A CMOS image sensor typically comprises an array of light sensitive picture elements (pixels), each of which may include transistors (switching transistor and reset transistor), capacitors, and a photo-sensitive element (e.g., a photo-diode). A CMOS image sensor utilizes light-sensitive CMOS circuitry to convert photons into electrons. The light-sensitive CMOS circuitry typically comprises a photo-diode formed in a silicon substrate. As the photo-diode is exposed to light, an electrical charge is induced in the photo-diode. Each pixel may generate electrons proportional to the amount of light that falls on the pixel when light is incident on the pixel from a subject scene. Furthermore, the electrons are converted into a voltage signal in the pixel and further transformed into a digital signal by means of an A/D converter. A plurality of periphery circuits may receive the digital signals and process them to display an image of the subject scene.

A CMOS image sensor may comprise a plurality of additional layers such as dielectric layers and interconnect layers formed on top of the substrate, wherein the interconnect layers are used to couple the photo diode with peripheral circuitry. The side having additional layers of the CMOS image sensor is commonly referred to as a front side, while the side having the substrate is referred to as a backside. Depending on the light path difference, CMOS image sensors can be further divided into two major categories, namely front-side illuminated (FSI) image sensors and back-side illuminated (BSI) image sensors.

In a FSI image sensor, light from the subject scene is incident on the front side of the CMOS image sensor, passes through dielectric layers and interconnect layers, and finally falls on the photo diode. The additional layers in the light path may limit the amount of light absorbed by the photo diode so as to reduce quantum efficiency. In contrast, in a BSI image sensor, light is incident on the backside of the CMOS image sensor without the obstructions from the additional layers. As a result, light can hit the photo diode through a direct path. Such a direct path helps to increase the number of photons converted into electrons.

In order to improve quantum efficiency of BSI image sensors, the substrate of BSI image sensors is thinned to a thickness in a range from about 2 um to 2.5 um. In addition, through an ion implantation process, a thin P+ layer having a thickness of about 100 Å may be formed on the thinned substrate to further improve quantum efficiency. Subsequently, a laser annealing process may be performed to activate the implanted P+ ions as well as repair crystal defects caused by the ion implantation process. Such a laser annealing process may cause dark mode image stripe patterns due to laser scanning boundary effects on the image sensor arrays.

BRIEF DESCRIPTION OF THE DRAWINGS

For a more complete understanding of the present disclosure, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the present embodiments are discussed in detail below. It should be appreciated, however, that the present disclosure provides many applicable inventive concepts that can be embodied in a wide variety of specific contexts. The specific embodiments discussed are merely illustrative of specific ways to make and use the embodiments of the disclosure, and do not limit the scope of the disclosure.

The present disclosure will be described with respect to embodiments in a specific context, a method for reducing image stripe patterns of a backside illuminated (BSI) image sensor. The embodiments of the disclosure may also be applied, however, to a variety of complementary metal-oxide semiconductor (CMOS) image sensors.

A BSI image sensor wafer 100 may comprise a plurality of image sensors and their corresponding peripheral circuits. According to the fabrication processes of BSI image sensors, the backside the substrate of the BSI image sensor wafer 100 may be thinned to a thickness in a range from about 2 um to about 2.5 um so that light can pass through the substrate (not shown) and hit photo diodes embedded in the substrate. Furthermore, a thin P+ ion layer may be formed on the backside of the thinned substrate to increase the number of photons converted into electrons. The P+ ion implantation process may cause crystal defects. In order to repair crystal defects and activate the implanted P+ ions, a laser annealing process may be performed on the backside of the BSI image sensor wafer 100.

Figure 1B:
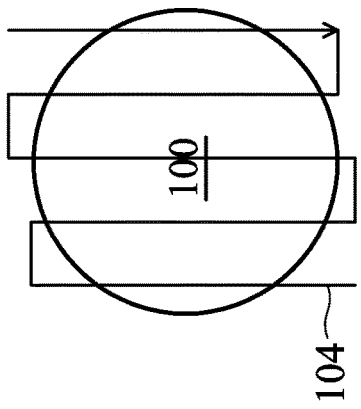
FIGS. 1A-1D illustrate an image pattern on a backside of a backside illuminated (BSI) image sensor wafer post a laser annealing process.
Figure 1C:
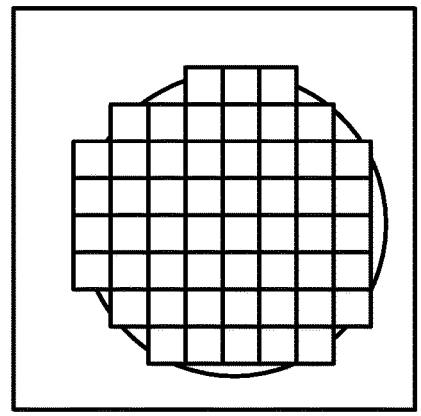
Figure 1A:
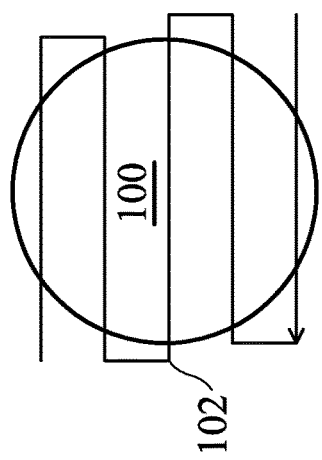

Referring initially to FIG. 1A, a horizontal laser scan of a BSI image sensor wafer is illustrated in accordance with an embodiment. A meandering line 102 indicates the movement path of a laser beam (not shown). Alternatively, a laser annealing process can be implemented by using a vertical laser scan of a BSI image sensor wafer 100 as shown in FIG. 1B. In accordance with an embodiment, the laser beam may be a line laser having an effective boundary size of 7 um by 27 mm. Furthermore, as shown in FIG. 1C, the laser beam may be a square laser having an effective boundary size of 15 mm by 15 mm. The detailed operation of the laser annealing process is well known in the art, and hence is not discussed herein to avoid repetition.

Figure 1D:
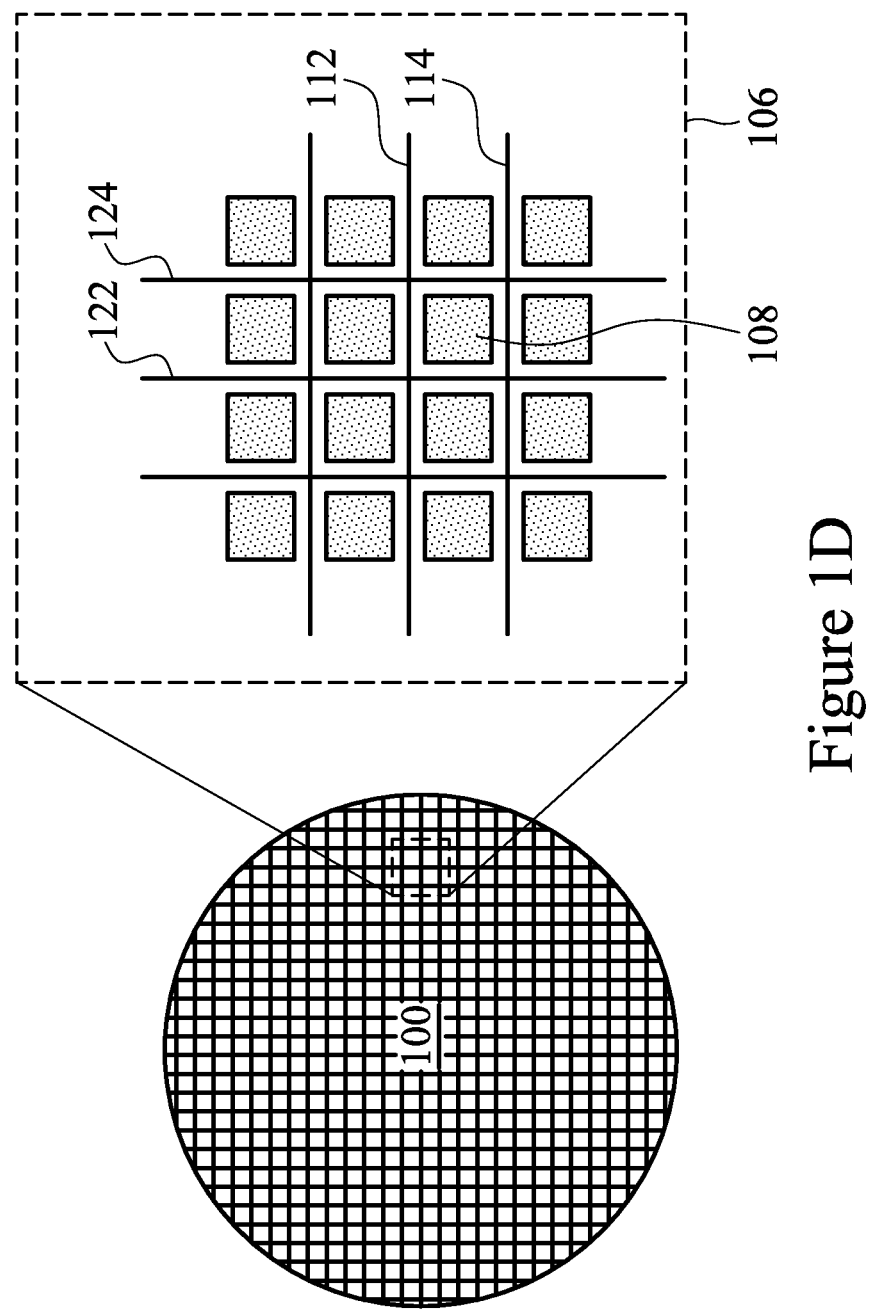

The boundary of the laser beam may be slightly greater than the boundary of an image sensor array (e.g., sensor array 108 shown in FIG. 1D). The boundary of the laser beam may generate a corresponding high laser energy region on the BSI image sensor wafer 100 because there may be a laser overlapping spot at the boundary of the laser beam when the laser beam moves along the path shown in FIG. 1A. Alternatively, the laser anneal process can be implemented by vertically scanning the BSI image sensor wafer 100 as shown in FIG. 1B. A meandering line 104 indicates the movement path of the laser beam. Similar to the horizontal laser scan, the vertical laser scan may cause a higher laser energy distribution at the boundary between two adjacent sensor arrays. Moreover, a square laser may have boundary effects, which may cause stripe patterns if the boundary of the square laser overlaps with the sensor.

FIG. 1D illustrates a top view of the backside of the BSI image sensor wafer post a laser annealing process in accordance with an embodiment. As shown in FIG. 1D, there may be a plurality of squares on the backside of the BSI image sensor wafer 100. Each square represents the boundary of a laser beam scanning through the BSI image sensor wafer 100. In order to better illustrate the detailed location relation between a boundary of the laser beam and a boundary of an image sensor array of the wafer 100, a portion of the BSI image sensor wafer 100 is enlarged in the dashed rectangle 106.

As shown in FIG. 1D, each gray square represents a sensor array, which may comprise a plurality of image sensors (not shown). Furthermore, each gray square (e.g., 108) is enclosed by a square formed by lines 112, 114, 122 and 124. The square represents the boundary of the laser beam. In order to avoid dark mode image stripe patterns, the laser beam is selected such that the laser beam boundary is not within gray squares (e.g., 108). However, due to process and laser equipment operation variations, the position of the laser beam may shift so that the laser beam boundary may fall within gray squares, with a concomitant image stripe pattern in the image sensors. As such, it is necessary to detect the location relation between the boundary of a laser beam and the boundary of image sensor arrays.

Figure 2:
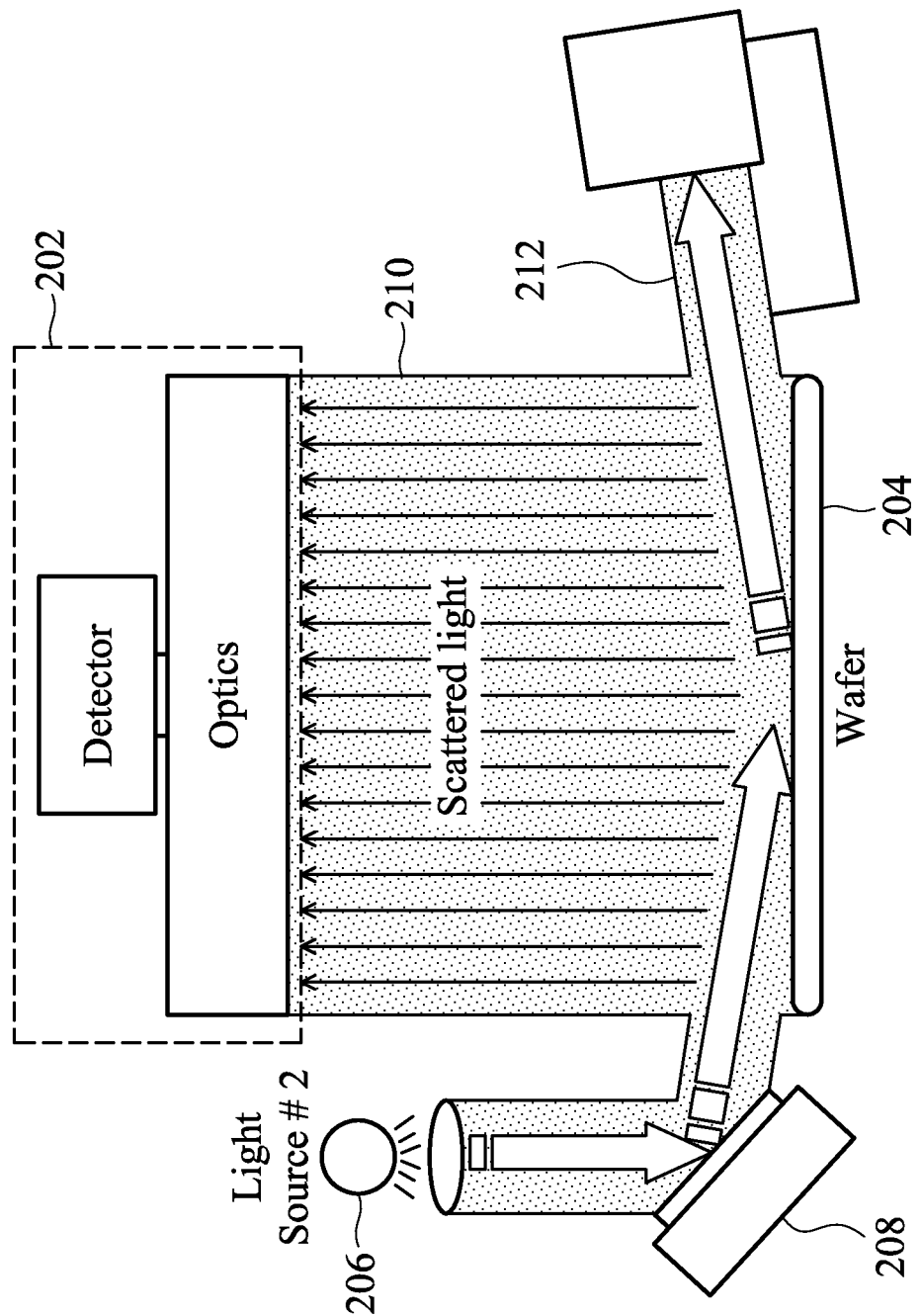
FIG. 2 illustrates a method of detecting a location relation between the boundary of a laser beam and the boundary of an image sensor array in accordance with an embodiment.

FIG. 2 illustrates a method of detecting the location relation between the boundary of a laser beam and a boundary of an image sensor array in accordance with an embodiment. After a laser annealing process, a light source 206 is applied to the backside surface of a BSI image sensor wafer 204 through a mirror 208. In accordance with an embodiment, the light source has a wavelength in a range from about 300 nm to about 400 nm. As shown in FIG. 2, by employing the mirror 208, a small incident angle can be achieved. Such a small incident angle helps to increase the intensity of the scattered light 210.

An optical detector 202 is employed to receive the scattered light and further analyze the image pattern retrieved from the scattered light. In accordance with an embodiment, the optical detector 202 may be implemented by using a haze measurement function from surface scanners (e.g., KLA-Tencor SP2). One advantageous feature of analyzing the image pattern of a BSI sensor wafer is that the location relation between the boundary of a laser beam and the boundaries of sensor arrays can be determined. As such, if the laser beam boundary falls within the boundary of a sensor array, the laser annealing equipment will be fine-tuned so that the laser beam boundary is outside the boundaries of sensor arrays.

Figure 3:
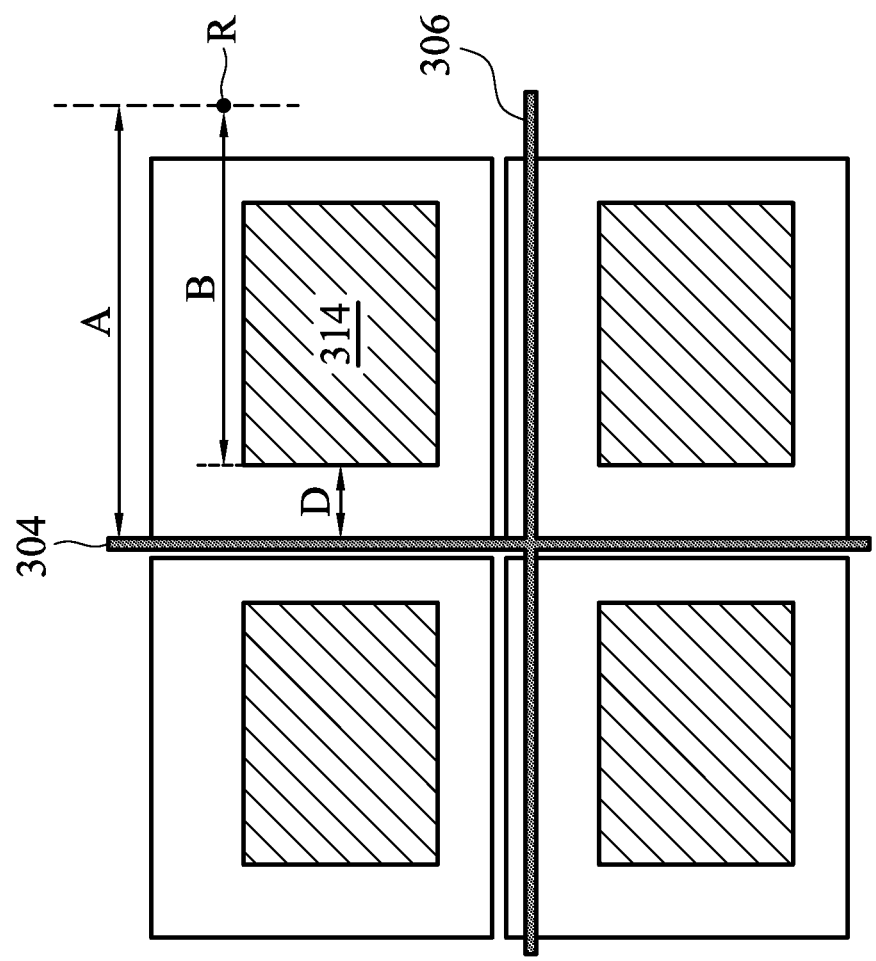
FIG. 3 illustrates an exemplary location relation between the laser beam boundary and the sensor array boundary in accordance with an embodiment.

FIG. 3 illustrates an exemplary location relation between the laser beam boundary and the sensor array boundary in accordance with an embodiment. Each sensor array may comprise four images sensors. In addition, each sensor array is enclosed by a white square representing the laser beam boundary. As shown in FIG. 3, a sensor 314 is adjacent to a first laser boundary line 304 and a second laser beam boundary line 306. The distance between a left edge of the sensor 314 and a reference point R is defined as B. Likewise, the distance between the boundary line 304 and the reference point R is defined as A. The process margin of the laser annealing process is defined as D, which is the difference between A and B. In accordance with an embodiment, when D is greater than a predetermined value (e.g., 200 um), the laser annealing process has enough margin and image stripe patterns may not occur. On the other hand, when D is less than the predetermined value, image stripe patterns may occur due to process and operation variations. As a consequence, the laser annealing equipment may be re-calibrated so as to keep the laser beam boundary from falling into the sensor array boundary.

Figure 4:
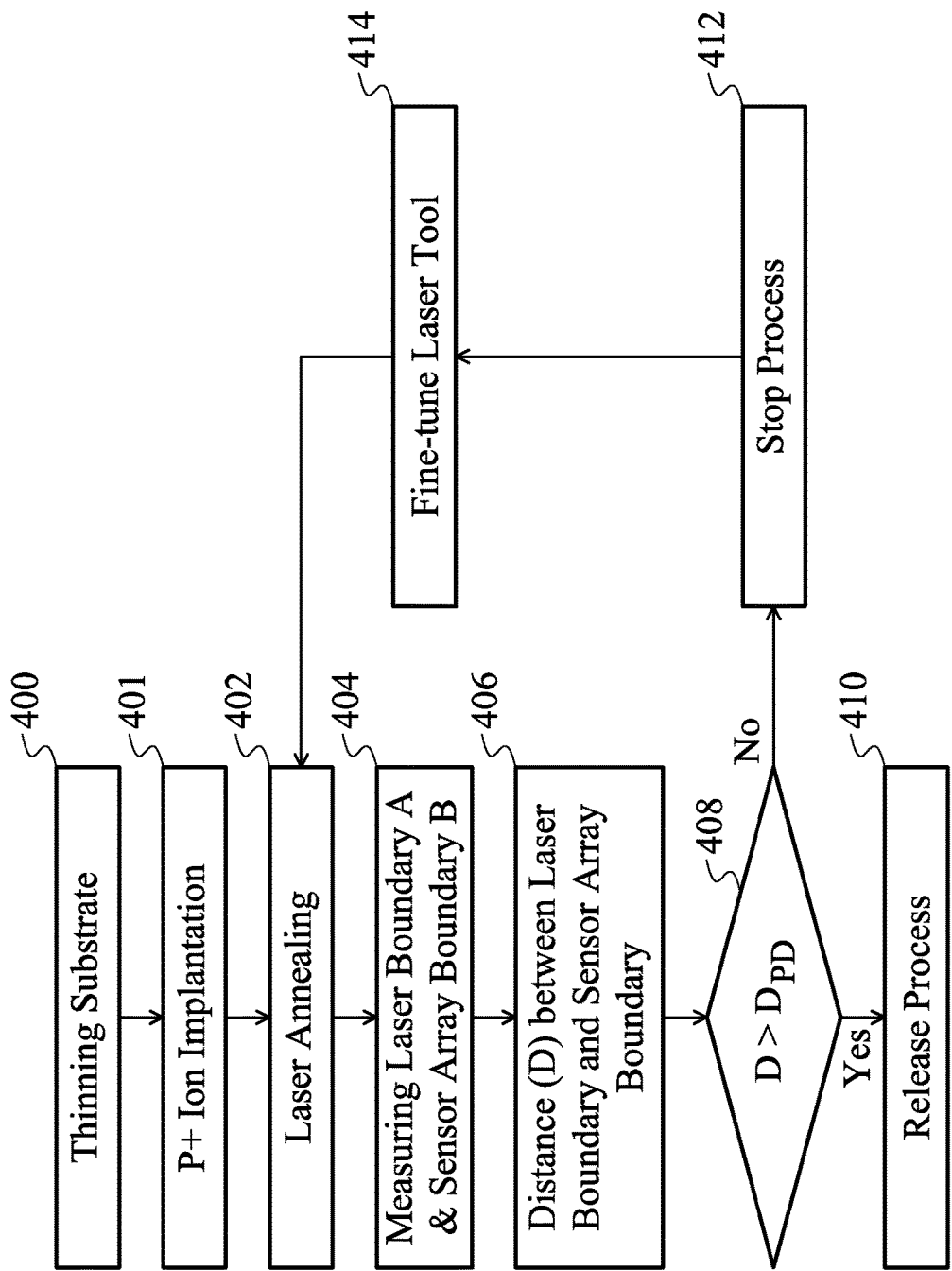
FIG. 4 illustrates a flow chart of a method for reducing image stripe patterns in accordance with an embodiment.

FIG. 4 illustrates a flow chart of a method for reducing image stripe patterns in accordance with an embodiment. At step 400, there may be a plurality of BSI image sensor wafers. According to the fabrication process of a BSI image sensor wafer, a substrate thinning process is performed on the backside of the substrate so that the thickness of the substrate is reduced to a range from about 2 um to about 2.5 um. Such a thinned substrate helps to allow light to propagate from the backside of the substrate. In other words, light can pass through the backside of the substrate and reach the photo active layers (e.g., photo diodes) without being absorbed.

At step 401, through an ion implantation process, a thin P+ layer may be formed on the thinned substrate to improve quantum efficiency. In accordance with an embodiment, the thin P+ layer has a thickness in a range from about 100 Å to about 1 um. At step 402, a laser annealing process is performed on the backside of the substrate to repair defects due to the P+ ion implantation and activate P+ ions. It should be noted that a laser beam in a laser annealing process may not have uniform energy distribution. For example, the energy density at the boundary region of the laser beam is not equal to the energy density at the center of the laser beam. In addition, there may be an overlapping laser spot at two adjacent image sensors when a laser beam scans through the two adjacent image sensors. Such an overlapping laser spot may lead to an image stripe pattern if it falls into the image sensor boundary. In other words, even if light does not hit the photo active layers of a BSI image sensor, the image sensor may still generate electrons. As such, an estimate of the boundary of a laser beam as well as the boundary of a sensor array is necessary to prevent the laser annealing process from generating image stripe patterns.

At step 404, a light source is applied to a laser-annealed wafer. From the scattered light pattern received by an optical detector, both the boundary of an image sensor array and the boundary of a laser beam can be calculated based upon the scattered light pattern. For example, the distance from an edge of an image sensor to a reference point is defined as B. The distance from an adjacent edge of a laser beam to the reference point is defined as A. At step 406, after measuring A and B, the distance between the laser beam and the image sensor can be calculated by subtracting B from A.

At step 408, if D is smaller than a predetermined value (e.g., 200 um), then the algorithm executes step 412 wherein the laser annealing process stops at step 412 and a fine-tune process of the laser annealing tool is performed at step 414. On the other hand, if D is greater than the predetermined value, the algorithm executes step 410 wherein the algorithm releases the laser annealing process for other BSI image sensor wafers.

Although embodiments of the present disclosure and its advantages have been described in detail, it should be understood that various changes, substitutions and alterations can be made herein without departing from the spirit and scope of the disclosure as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A system comprising:
a mirror;
a light source configured to point toward the mirror in a direction perpendicular to a top surface of a wafer, wherein, when excited, a light beam from the light source is reflected by the mirror and strikes the top surface of the wafer with an incident angle of less than 90 degrees; and
an optical detector over the wafer capable of generating a surface image based upon scattered light from the top surface of the wafer; and
a processor configured to:
calculate a boundary of a sensor array and a boundary of a laser beam based on the surface image;
calculate a distance between the boundary of the sensor array and the boundary of the laser beam; and
re-calibrate a laser when the distance is less than a predetermined value.

2. The system of claim 1, wherein:
the light source has a wavelength in a range from about 300 nm to about 400 nm.

3. The system of claim 1, wherein:
the sensor array comprises a plurality of image sensors.

4. The system of claim 1, wherein:
the optical detector is implemented by using a haze measurement function from a surface scanner.

5. The system of claim 1, wherein:
the wafer is of a thickness in a range from about 2 um to about 2.5 um.

6. The system of claim 5, further comprising:
a P+ layer on the wafer.

7. The system of claim 6, wherein:
the P+ layer is of a thickness in a range from about 100 angstroms to about 10,000 angstroms.

8. A system comprising:
a mirror;
a light source configured to be optically coupled to a top surface of a wafer by way of the mirror, the light source pointing toward the mirror in a direction perpendicular to the top surface of the wafer, wherein, when excited, a light beam from the light source is scattered from the top surface of the wafer; and
an optical detector over the wafer capable of generating a surface image based upon the scattered light beams that strike the optical detector; and
a processor configured to:
calculate a boundary of a sensor array and a boundary of a laser beam based on the surface image;
calculate a distance between the boundary of the sensor array and the boundary of the laser beam; and
re-calibrate a laser when the distance is less than a predetermined value.

9. The system of claim 8, wherein:
the laser beam is used in a laser annealing process.

10. The system of claim 8, wherein:
the top surface of the wafer is a backside of the wafer.

11. The system of claim 8, wherein:
the light source is of a wavelength in a range from 300 nm to 400 nm.

12. The system of claim 8, wherein:
the sensor array comprises a plurality of image sensors.

13. An apparatus comprising:
a mirror;
an optical detector capable of generating a surface image based upon scattered light signals from a top surface of a wafer that strike the optical detector;
a processor, the processor calculating a boundary of a sensor array and a boundary of a laser beam, the processor further calculating a distance between the boundary of the sensor array and the boundary of the laser beam, and the processor re-calibrating a laser annealing process if the distance is less than a predetermined value; and
a light source over the mirror, the light source optically coupled to the top surface of the wafer, wherein, when excited, light from the light source is directed toward the top surface of the wafer with a small incident angle by way of the mirror to produce the scattered light signals, wherein the light from the light source strikes the mirror in a direction perpendicular to the top surface of the wafer.

14. The apparatus of claim 13, wherein the mirror is coupled between the light source and the top surface of the wafer.

15. The apparatus of claim 13, wherein the wafer is a backside illuminated sensor wafer.

16. The apparatus of claim 15, wherein the sensor array comprises a plurality of sensors, each of which comprises a photo diode embedded in a substrate of the wafer.

17. The apparatus of claim 13, wherein the light source is of a wavelength in a range from 300 nm to 400 nm.

18. The apparatus of claim 13, wherein the wafer has a thickness in a range from 2 um to 2.5 um.

19. The system of claim 8, wherein the laser directs the laser beam toward the top surface of a wafer to form a P+ layer on the top surface of the wafer.

20. The system of claim 19, wherein the wafer is of a thickness in a range from about 2 um to about 2.5 um before the laser directs the laser beam toward the top surface of a wafer to form the P+ layer.

* * * * *